(12) United States Patent
Sterzbach

(10) Patent No.: US 11,874,322 B1
(45) Date of Patent: Jan. 16, 2024

(54) DEVICE AND METHOD FOR SIMULATING A BATTERY

(71) Applicant: Rohde & Schwarz GmbH & Co. KG, Munich (DE)

(72) Inventor: Bernhard Sterzbach, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 17/853,373

(22) Filed: Jun. 29, 2022

(51) Int. Cl.
*G01R 31/00* (2006.01)
*G01R 31/28* (2006.01)
*G01R 31/56* (2020.01)

(52) U.S. Cl.
CPC ..... *G01R 31/2839* (2013.01); *G01R 31/2849* (2013.01); *G01R 31/56* (2020.01)

(58) Field of Classification Search
CPC ........... G01R 31/2839; G01R 31/56; G01R 31/2849; G01R 31/367; G01R 31/374; G01R 31/379; G01R 31/382; G01R 31/387; G01R 31/389; G01R 31/392; G01R 31/3842; G01R 31/3606; G01R 31/3624; G01R 31/3634; G01R 31/3648; G01R 31/3651; G01R 31/3662; G01R 31/3665; G01R 31/3675; G01R 31/3679
See application file for complete search history.

(56) References Cited

U.S. PATENT DOCUMENTS

| | | | |
|---|---|---|---|
| 9,622,294 B1 | 4/2017 | Ostanek | |
| 11,480,626 B1* | 10/2022 | Sarwat | H02J 7/0016 |
| 2009/0295395 A1* | 12/2009 | Bertness | G01R 31/364 |
| | | | 324/426 |
| 2012/0119765 A1* | 5/2012 | Bracker | G01R 31/36 |
| | | | 324/750.01 |
| 2014/0377598 A1* | 12/2014 | Reihlen | H01M 10/4207 |
| | | | 429/50 |
| 2021/0391601 A1* | 12/2021 | Doak | H01M 10/654 |
| 2022/0057454 A1* | 2/2022 | Kunisch | G01R 31/2848 |

* cited by examiner

*Primary Examiner* — Thang X Le
(74) *Attorney, Agent, or Firm* — DITTHAVONG, STEINER & MLOTKOWSKI

(57) ABSTRACT

The present disclosure relates to a device for simulating a battery of a device-under-test (DUT), comprising a battery simulation unit adapted to fit into a battery reception unit of the DUT; and a controller configured to control the battery simulation unit to simulate electrical characteristics of a battery; wherein the battery simulation unit is configured to supply electrical power to the DUT or drain electrical power from the DUT based to the simulated electrical characteristics. The device further comprises a temperature sensor configured to measure a temperature at or in the battery simulation unit; and a heater unit configured to heat the battery simulation unit.

16 Claims, 5 Drawing Sheets

DEVICE AND METHOD FOR SIMULATING A BATTERY

TECHNICAL FIELD

The present disclosure relates to a battery simulator. In particular, the present disclosure relates to a device and to a method for simulating a battery of a device-under-test (DUT) as well as to a test system comprising such a battery simulation device.

BACKGROUND ART

Developers of battery powered devices, e.g. portable electronic devices, use battery simulators to test their devices. A typical battery simulator consists of an adaptive power supply which supplies a device-under-test (DUT) with electrical power and thereby mimics the characteristics of a conventional battery. Such battery simulators are sometimes also referred to as battery emulators.

Most battery simulators respectively emulators only mimic the electrical behavior of a battery. However, real batteries are also subject to temperature fluctuations, especially during charging or discharging. It would be desirable to also test how such temperature fluctuations of a battery affects the DUT performance, especially when testing high end smartphone designs where the device performance, e.g. data throughput or recording of high resolution videos, is often limited by thermal constraints.

SUMMARY

Thus, there is a need to provide an improved device and an improved method for simulating the battery of a device-under-test (DUT) which allow testing the DUT response to battery temperature fluctuations.

These and other objectives are achieved by the embodiments provided in the enclosed independent claims. Advantageous implementations of the present disclosure are further defined in the dependent claims.

According to a first aspect, the present disclosure relates a device for simulating a battery of a device-under-test (DUT). The device comprises a battery simulation unit adapted to fit into a battery reception unit of the DUT; and a controller configured to control the battery simulation unit to simulate electrical characteristics of a battery; wherein the battery simulation unit is configured to supply electrical power to the DUT or drain electrical power from the DUT based to the simulated electrical characteristics. The device further comprises a temperature sensor configured to measure a temperature at or in the battery simulation unit; and a heater unit configured to heat the battery simulation unit.

This achieves the advantage that the electrical and the thermal characteristics of a battery can be simulated. In this way, it can be tested how the DUT responds to the thermal behavior of a battery during different battery operating modes, e.g. typical heating of the battery during charging or discharging of the battery.

The device for testing the battery can be a battery simulation respectively battery emulation apparatus. By simulating the electrical characteristics of a battery and supplying and/or draining electrical power to respectively from the DUT based on said simulation, the device can emulate a battery for the DUT.

The DUT can be a battery powered electronic device, in particular a handheld electronic device. For instance, the DUT is a mobile phone or a radio device. The battery reception unit can be a battery compartment of the DUT. The battery simulation unit can be adapted to fit into the battery compartment.

The simulated electrical characteristics can comprise a voltage and a charge or discharge current. In particular, by simulating these electrical characteristics, the battery simulation unit emulates a battery with a corresponding electrical behavior.

The battery simulation unit can comprise output terminals, in particular pins, for providing an electrical connection to the DUT.

The heater unit can comprise a heating element that is placed on or in the battery unit. The heating element can be a resistive heating pad. The controller can control the heater unit to heat the heating element to a variable heating temperature.

In particular, the temperature measured by the temperature sensor can be influenced by the temperature of the battery simulation unit, the heating provided by the heater unit and/or the temperature of DUT (e.g., resulting from a heating of a processor in the DUT).

The controller can comprise a processing unit and/or a memory. The controller can be external to the battery simulation unit and connected to the battery simulation unit via a wired connection. Alternatively, the controller can be integrated in the battery simulation unit.

In an embodiment, the device comprises a voltage and/or current sensor configured to measure the voltage and/or current of the electrical power that is supplied to the DUT or drained from the DUT by the battery simulation unit.

In an embodiment, the controller is configured to control the heater unit based on an electrochemical battery model.

This achieves the advantage that the device can accurately simulate the electrical and/or thermal characteristics of a real battery based on an electrochemical model said battery. The electrochemical model can comprise or be based on various battery parameters, such as SOC (state of charge), capacity, internal resistance, age, and/or temperature.

In an embodiment, the controller is configured to further control the heater unit based on the measured current that is supplied to the DUT or drained from the DUT.

The current that is supplied to/drained from the DUT can be inserted as a parameter in the electrochemical battery model to calculate a typical temperature of a battery when supplying respectively draining said current. The heater unit can then be controlled to heat the battery simulation unit to this calculated temperature.

In an embodiment, the controller is configured to adjust the electrochemical battery model based on the temperature measured by the temperature sensor.

This achieves the advantage that a real live battery can be simulated more accurately. The controller can insert the temperature as a parameter in the electrochemical model. In this way, a temperature feedback can be provided to the controller, allowing the controller to accurately heat the battery simulation unit to a target heating temperature.

In an embodiment, the controller is configured to detect if the current that is supplied to the DUT or drained from the DUT changes in case the temperature measured by the temperature sensor exceeds a threshold value.

This achieves the advantage that a thermal management of the DUT can be tested. For instance, it can be tested if the DUT reduces its electrical power consumption if the battery temperature exceeds the threshold temperature value.

In an embodiment, the controller is configured to control the heater to emulate a characteristic heat emission during a charging or discharging of a battery.

At the same time, the controller can be configured to control the battery simulation unit to provide the voltage and/or current characteristics according to the charging or discharging process of the simulated battery.

In an embodiment, the battery simulation unit comprises at least one data interface which is configured to forward data to the DUT. For instance, this data interface can be used for a data communication between the DUT and the controller.

In an embodiment, the controller is configured to provide battery identification information and to control the data interface to forward said battery identification information to the DUT. The battery identification information can comprise a battery ID or the like.

In an embodiment, the controller is configured to generate simulated temperature sensor readings and to control the data interface to forward said simulated temperature sensor readings to the DUT.

This achieves the advantage that the battery simulation device can simulate a real battery with a temperature sensor.

In an embodiment, the simulated temperature sensor readings comprise temperature values that deviate from the temperature values measured with the temperature sensor.

This achieves the advantage that a battery with a faulty or inaccurate temperature sensor can be simulated. In this way, it can be tested how the DUT reacts to such "faulty" temperature sensor readings that deviate from an actual battery temperature.

The temperature values of the simulated temperature sensor readings and the measured temperature values can deviate by more than 5° C., 10° C., 20° C., 30° C., 40° C. or 50° C.

In an example, the controller is configured to control the battery simulation unit to simulate the electrical characteristics according to a predefined battery model. The battery model can correspond to a real battery type, such as AG13, AAA, CR2032 or BR-A. The predefined battery model can be the electrochemical battery model, or it can comprise or define the electrochemical battery model. The battery model can be stored in a memory of the device in the form of a parameter set.

According to a second aspect, the present disclosure relates a test system for a DUT. The test system comprises a test chamber for inserting the DUT; a device for simulating a battery of the DUT according to the first aspect of the disclosure; and one or more sensor units for monitoring the DUT.

The test chamber can be a shielded test cell for temperature testing. Additionally or alternatively, the test chamber can be an anechoic chamber.

In an embodiment, the one or more sensor units comprise a communication sensor unit which is configured to exchange communication data with the DUT; wherein the communication sensor unit is configured to monitor a data transmission rate of said communication with the DUT as a function of the heating of the battery simulation unit by the heater unit and/or the temperature measured with the temperature sensor.

In an embodiment, the one or more sensor units comprise a DUT temperature sensor; wherein the DUT temperature sensor is configured to monitor a temperature of the DUT while the battery simulation unit supplies the DUT with electrical power or drains electrical power from the DUT.

According to a third aspect, the present disclosure relates a method for simulating a battery of a device-under-test (DUT). The method comprises the steps of: inserting a battery simulation unit into a battery reception unit of the DUT; simulating electrical characteristics of a battery with the battery simulation unit; supplying electrical power to the DUT or draining electrical power from the DUT based on the simulated electrical characteristics; measuring a temperature at or in the battery simulation unit; and heating the battery simulation unit.

In an embodiment, the method comprises the further step of: measuring a voltage and/or current of the electrical power that is supplied to the DUT or drained from the DUT.

The method can be carried out by the device according to the first aspect of the disclosure.

The above description with regard to device according to the first aspect of the disclosure and the test system according to the second aspect of the disclosure is correspondingly valid for the method according to the third aspect of the disclosure.

BRIEF DESCRIPTION OF THE DRAWINGS

The above described aspects and implementation forms of the present disclosure will be explained in the following description of specific embodiments in relation to the enclosed drawings, in which.

DETAILED DESCRIPTIONS OF EMBODIMENTS

Figure 1:
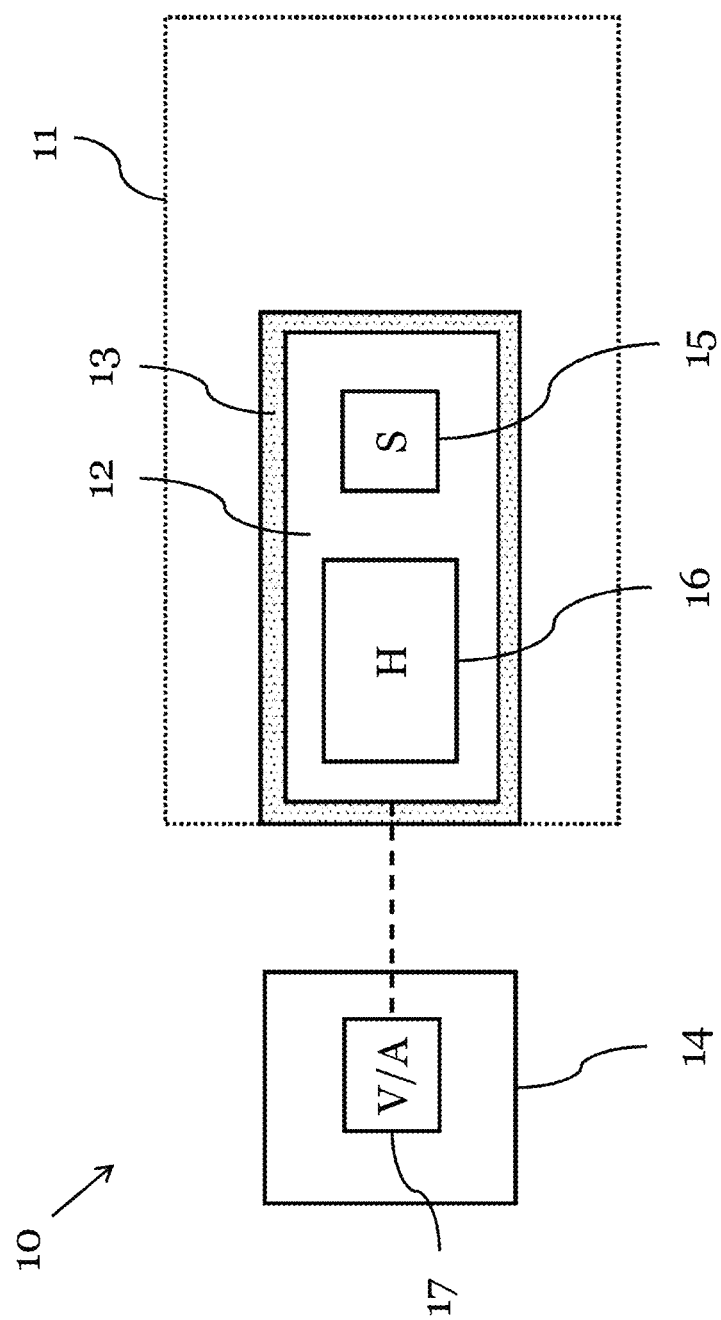
FIG. 1 shows a schematic diagram of a device for simulating a battery according to an embodiment.

FIG. 1 shows a schematic diagram of a device 10 for simulating a battery of a DUT 11 according to an embodiment.

The device 10 (in the following also referred to as: battery simulation device 10) comprises a battery simulation unit 12 adapted to fit into a battery reception unit 13 of the DUT 11 and a controller 14 configured to control the battery simulation unit 12 to simulate electrical characteristics of a battery, wherein the battery simulation unit 12 is configured to supply electrical power to the DUT 11 or to drain electrical power from the DUT 11 based to the simulated electrical characteristics. The device 10 further comprises a temperature sensor 15 configured to measure a temperature at or in the battery simulation unit 12 and a heater unit 16 configured to heat the battery simulation unit 12.

The battery simulation unit 12 can be a battery replacement part, e.g. a component which has the same shape and size of a battery for the DUT 11. The battery replacement part can be inserted into the DUT 11 instead of a conventional battery. For instance, the replacement part is inserted in a battery compartment of the DUT 11. The battery simulation unit 12 can have output terminals for electrically connecting the battery simulation unit 12 to the DUT 11. The output terminals can be placed on the same locations than the respective terminals of a conventional battery for the DUT 11.

The controller 14 can be configured to control the inserted battery simulation unit 12 to electrically simulate a battery. For instance, the controller can control the battery simulation unit 12 to provide power to the DUT 11 in order to simulate a battery discharge process or to drain, i.e. consume, power from the DUT 1 in order to simulate a battery charging process. At the same time, the controller 14 can control the heater unit 16 to emulate a characteristic heat emission of a battery during the respective charging or discharging process. Thus, the battery simulation device 10 can simulate respectively emulate both the electrical and the corresponding thermal behavior of a battery during a charging and/or a discharging of said battery. In other words, the battery simulation device 10 can simulate the heating of a battery that is inserted in a battery reception unit 13 of the DUT 11 according to the current operating conditions of the DUT 11.

The controller 14 can be an external component which is not inserted into the DUT 11 and which is connected to the battery simulation unit 12 via a wired connection. The controller 14 can comprise a processing unit which is configured to control the battery simulation unit 12 and/or the heating unit 16.

The temperature sensor 15 can be arranged on the battery simulation unit 12 as depicted in FIG. 1. Alternatively, the temperature sensor 15 can be a separate component connected to the controller 14 which can be arranged at a different location in or on the DUT 11.

The heating unit 16 can be a heating element, e.g. a resistive heating pad, which is arranged in or on the battery simulation unit 12. The controller 14 can be configured to control the heating unit 16 to heat up to a target heating temperature.

The battery simulation device 10 can further comprise a voltage and/or current sensor 17 which is configured to measure the voltage and/or current of the electrical power that is supplied to the DUT 11 or drained from the DUT 11 by the battery simulation unit 12.

The controller 14, in particular the processing unit of the controller 14, can be configured to execute an electrochemical battery model. The electrochemical battery model can comprise various battery parameters, such parameters: SOC (state of charge), capacity, internal resistance, age, and/or temperature.

The controller 14 can further be configured to control the heater unit 16 based on the electrochemical battery model and/or based on the measured current that is supplied to the DUT or drained from the DUT by the battery simulation unit 12. Thus, the battery simulation unit 12 can be heated to temperatures which are calculated by an electrochemical battery model and, thus, correspond to realistic battery temperatures during typical battery charging or discharging processes.

For instance, the measured current that is supplied to respectively drained from the DUT 11 can be inserted as a parameter in the electrochemical battery model to calculate a typical temperature of a battery for said discharging/charging current. The heater unit 16 can then be controlled to heat the battery simulation unit 12 to this calculated temperature.

The controller 14 can further adapt the electrochemical model based on the measured temperature which can, in turn, result in a change of the temperature of the heater unit. Thus, the temperature sensor 15 readings can be used to further adjust parameters of the electrochemical model of the simulated battery. The detection of excessive temperature by the temperature sensor 15 can trigger an alarm in the controller 14. As a results, the controller 14 can shut down the battery simulation device and/or the DUT.

The controller 14 can further be configured to control the battery simulation unit 12 to simulate the electrical characteristics of the battery based on a predefined battery model. The predefined battery model can correspond to a real battery type, such as AG13, AAA, CR2032 or BR-A. The predefined battery model can be identical to the electrochemical battery model, or it can comprise or define the electrochemical battery model. The predefined battery model can be stored in a memory of the controller 14.

The controller 14 can further be configured to detect if the measured current that is supplied to the DUT 11 or drained from the DUT 11 changes in case the temperature measured by the temperature sensor 15 exceeds a threshold value. In this way, it can be tested if a charging/discharging current is reduced by the DUT 11 if the battery simulation unit 12 in the battery reception unit 13 of the DUT 11 reaches a certain temperature.

For instance, the temperature measured by the temperature sensor 15 can result from the heating unit 16 and from the heating of the DUT 11 itself (e.g., due a heating of a DUT processor during operation). The DUT 11 can react to this heating by reducing a charging/discharging current supplied to/drained from the battery simulation unit 12. The battery simulation device 10 can in turn react to this reduced charging/discharging current by reducing the heating of the battery simulation unit 12 via the heating unit 16 (as would occur in a real battery). This allows for a testing of the DUT 11 under realistic test conditions.

Figure 2A:
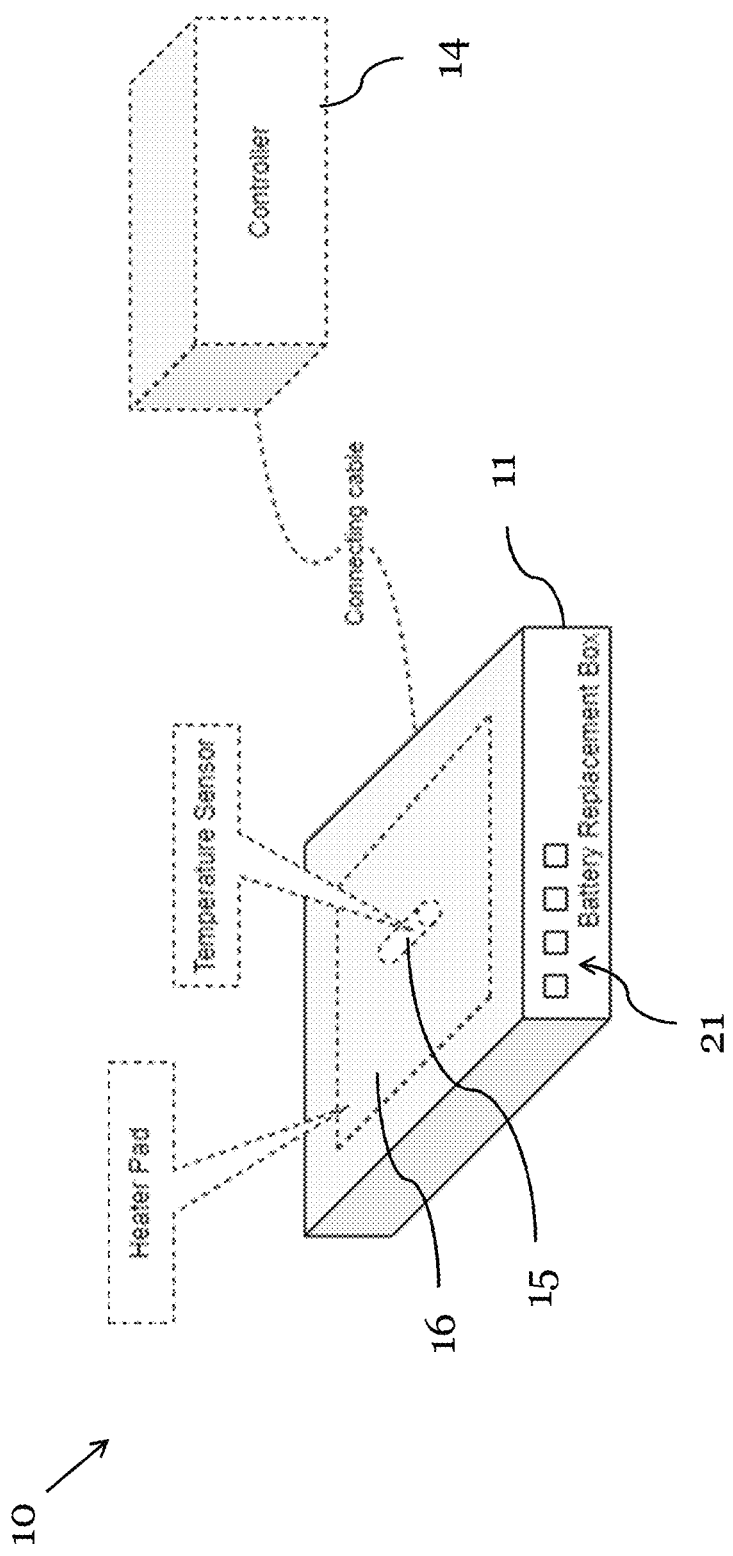
FIGS. 2A-B show schematic diagrams of a device for simulation a battery according to an embodiment.
Figure 2B:
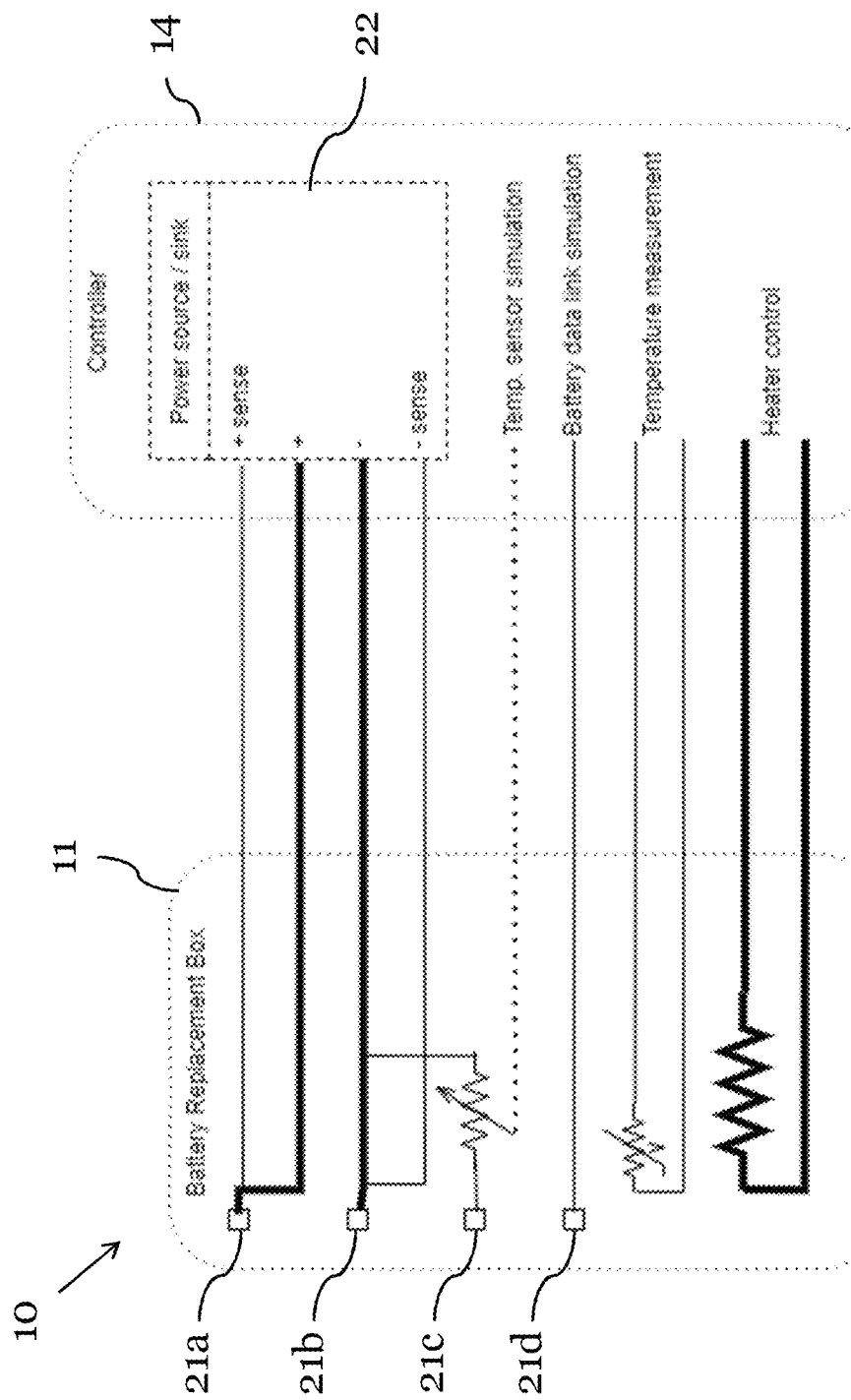

FIGS. 2A and 2B show schematic diagrams of the device 10 for simulation a battery according to an embodiment. The device 10 shown in FIGS. 2A and 2B can be essentially identical to the device 10 shown in FIG. 1.

As shown in FIG. 2A, the battery simulation unit 12 can be a battery replacement box. This battery replacement box can be inserted in a battery compartment of a DUT 11 instead of a conventional battery. In particular, the battery replacement box has the same size as a conventional battery of the DUT 11.

The heater unit 16 can be a heater pad which is located on the battery simulation unit 12. The heater unit 16 can thereby be arranged to uniformly heat up the battery simulation unit 12 to a target heating temperature.

The temperature sensor 15 can be arranged on or in the battery simulation unit 12, e.g. directly adjacent to the heater pad.

The battery simulation unit 12 can further comprise a number of pins 21. Via these pins 21, the battery simulation unit 12 can be electrically connected to the DUT 11 for providing respectively draining the electrical power to/from the DUT and for exchanging communication data with the DUT 11.

FIG. 2B shows the various electrical and data connections between the battery simulation unit 12 and the controller 14 according to an embodiment. In particular, FIG. 2B shows a possible assignment of the pins 21*a-d* of the battery simulation unit 12.

The first two pins 21*a*, 21*b* can form electrical output respectively input terminals. These pins 21 can be electrically connected to a power source respectively sink 22 in the controller 14 which is configured to provide respectively drain the electrical power to/from the DUT 11 according to the simulated electrical battery characteristics. The pins 21*a*, 21*b* can further be connected to the voltage and/or current sensor 17 (not shown in FIG. 2B).

The other pins 21*c*, 21*d* can form respective data interfaces for exchanging communication data with the DUT 11.

For instance, the controller 14 can be configured to simulate a microcontroller within a conventional battery. Pin 21*c* can form a data link for forwarding simulated communication signals between the controller 14 and the DUT 11. For example, the controller 14 is configured to generate battery identification information, e.g. a battery ID or similar information, of the simulated battery. The pin 21c can be configured to forward said battery identification information to the DUT. In this way, an identification of a battery by the DUT 11 can be tested.

The controller 15 can further be configured to generate simulated temperature sensor readings. These simulated temperature sensor readings can mimic temperature sensor readings from a real temperature sensor in a conventional battery. The pin 21d can be configured to forward these simulated temperature sensor readings to the DUT 11.

In an example, the controller 14 is configured to simulate temperature sensor readings which comprise temperature values that deviate from the temperature values measured with the temperature sensor 15. In this way, the handling of battery faults by the DUT 11 (e.g., loose contact, sensor malfunction, thermal runaway) can be tested safely. In particular, it can be tested if the DUT 11 reacts in a certain way to the deviating temperatures, e.g. determines that there is a malfunction and/or only charges battery with a minimal or a reduced current. The temperature values of the simulated temperature sensor readings and the measured temperature values can deviate by more than 5° C., 10° C., 20° C., 30° C., 40° C. or 50° C. The simulated temperature values can be higher or lower as the temperature measured with the temperature sensor 15.

In a further possible operating mode of the device 10, the controller 14 can be configured to generate simulated temperature sensor readings and to forward said simulated temperature sensor readings to the DUT 11 without heating the battery simulation unit 12 at all (without using the heater unit 16 and/or the temperature sensor 15). In this way, it can be tested how the DUT 11 responds to different battery temperature readings of a simulated battery.

Figure 3:
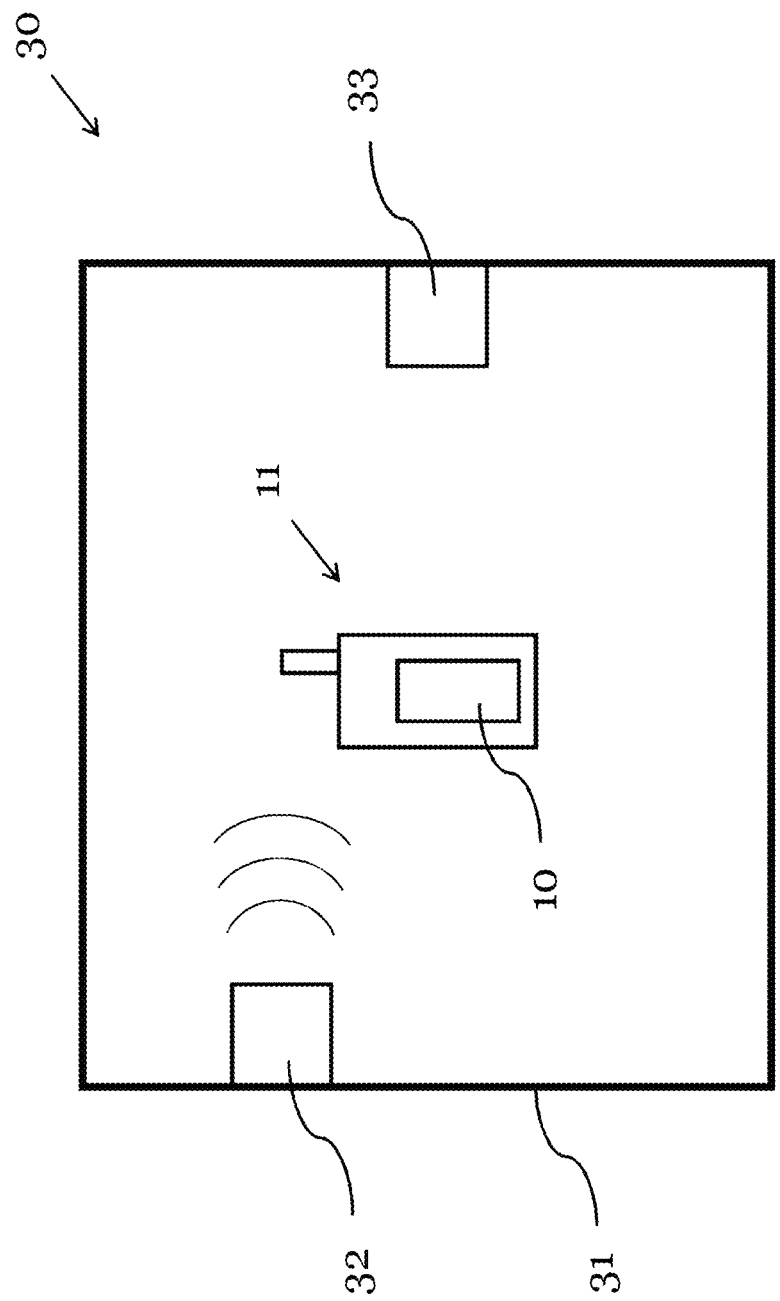
FIG. 3 shows a schematic diagram of a test system according to an embodiment.

FIG. 3 shows a schematic diagram of a test system 30 for the DUT 11 according to an embodiment.

The test system 30 comprises a test chamber 31 for inserting the DUT 11, the battery simulation device 10 for simulating the battery of the DUT 11 and one or more sensor units 32, 33 for monitoring the DUT 11.

The test chamber 31 can be a shielded test cell for temperature testing and/or an anechoic chamber.

The battery simulation device 10 can be a device as shown in any one of FIGS. 1, 2A-B. The battery simulation unit 11 of the device 10 can be inserted into the DUT 11 while the DUT 11 is arranged in the test chamber 31. The controller 14 (not shown in FIG. 3) can be arranged outside of the test chamber 31.

The DUT 11 can be a communication device, in particular a 5G capable communication device. One sensor unit of the test system 30 can be a communication sensor unit 32 which is configured to exchange communication data with the DUT 11. For instance, the communication sensor unit 32 comprises a transceiver for exchanging radio frequency (RF) signals with the DUT 11. For example, the communication sensor unit 32 and the DUT 11 can be configured to exchange communication data according to a 5G communication standard.

The communication sensor unit 32 can be configured to monitor a data transmission rate of said communication with the DUT 11 dependent on the heating of the battery simulation unit by the heater unit 16 and/or dependent on the temperature sensor 15 of the battery simulation device 10. For example, strong heating of a mobile device can lead to a limitation of the data rate in 5G communication.

Another sensor unit of the test system 30 can be a DUT temperature sensor 33 which is configured to monitor a temperature of the DUT 11 while the battery simulation unit 12 supplies the DUT 11 with electrical power or drains electrical power from the DUT 11.

The DUT temperature sensor 33 can be an infrared imaging sensor which is configured to monitor a surface temperature of the DUT 11, e.g. during a simulated battery charging or discharging.

The test system can comprise at least one further sensor unit for monitoring an operating state of the DUT 11 while supplying or draining the DUT 11 with electrical power by means of the battery simulation unit 12 and/or heating the DUT 11 by means of the heater unit 16. For instance, the at least one further sensor unit can detect if a screen of the DUT 11 is switched of and/or if the DUT 11 shuts down in case the temperature of the battery simulation unit 12 exceeds a threshold value.

By means of the above battery simulation device 10 and the test system 30, the thermal management in a battery powered DUT 11 can be tested efficiently in the lab, thereby taking into account the heat dissipation of a simulated battery during charging or discharging.

Thus, the simulation device 10 can make the DUT testing faster, safer and more reproducible which is an important advantage, for example when testing high end smartphone designs where performance (data throughput, recording of high-resolution video) is often limited by thermal constraints. This allows for a more realistic testing of the DUT performance as compared to mathematical modelling of thermal management or extrapolation from lab tests with conventional battery simulators. Furthermore, the dangers and inconveniences of using real batteries can be avoided.

Figure 4:
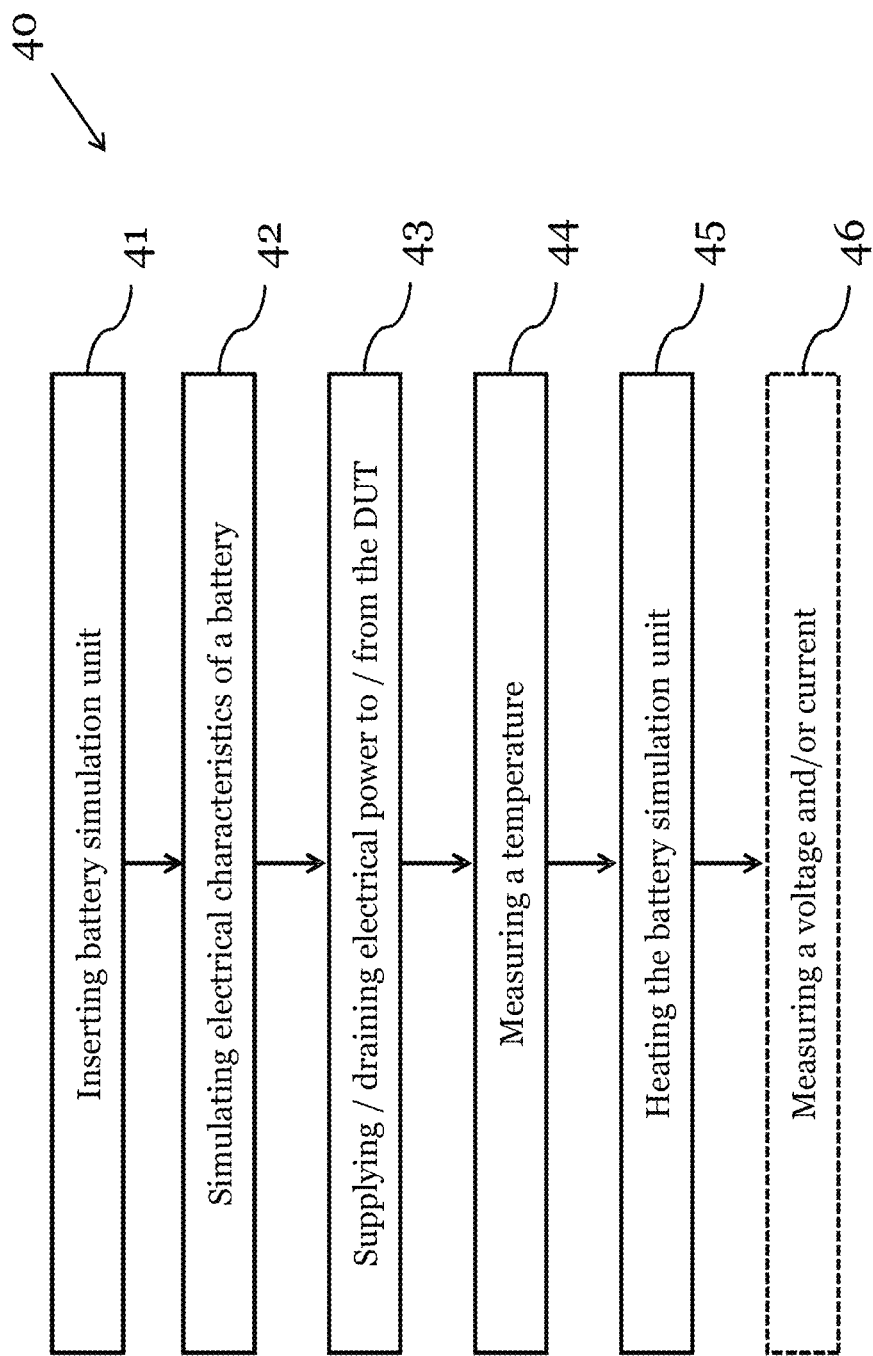
FIG. 4 shows a flow diagram of a method for simulating a battery according to an embodiment.

FIG. 4 shows a method 40 for simulating a battery of the DUT 11 according to an embodiment. The method 40 can be carried out with the battery simulation device 10 shown in any one of FIGS. 1-3.

The method 40 comprises the steps of: inserting 41 the battery simulation unit 12 of the battery simulation device 10 into the battery reception unit 13 of the DUT 11; simulating 42 electrical characteristics of a battery with the battery simulation unit 12; supplying 43 electrical power to the DUT 11 or draining electrical power from the DUT 11 based on the simulated electrical characteristics; measuring 44 a temperature at or in the battery simulation unit 12; and heating 45 the battery simulation unit 12.

The method 40 can further comprise the optional step of: measuring 46 a voltage and/or current of the electrical power that is supplied to the DUT 11 or drained from the DUT 11.

All features described above or features shown in the figures can be combined with each other in any advantageous manner within the scope of the disclosure.

The invention claimed is:

1. A device for simulating a battery of a device-under-test (DUT), comprising:
   a battery simulation unit adapted to fit into a battery reception unit of the DUT;
   a controller configured to control the battery simulation unit to simulate electrical characteristics of a battery;
   wherein the battery simulation unit is configured to supply electrical power to the DUT or drain electrical power from the DUT based to the simulated electrical characteristics;
   a temperature sensor configured to measure a temperature at or in the battery simulation unit; and
   a heater unit configured to heat the battery simulation unit.

2. The device of claim 1, further comprising:
a voltage and/or current sensor configured to measure a voltage and/or current of the electrical power that is supplied to the DUT or drained from the DUT by the battery simulation unit.

3. The device of claim 1,
wherein the controller is configured to control the heater unit based on an electrochemical battery model.

4. The device of claim 2
wherein the controller is configured to further control the heater unit based on the measured current that is supplied to the DUT or drained from the DUT.

5. The device of claim 3,
wherein the controller is configured to adjust the electrochemical battery model based on the temperature measured by the temperature sensor.

6. The device of claim 2,
wherein the controller is configured to detect if the current that is supplied to the DUT or drained from the DUT changes in case the temperature measured by the temperature sensor exceeds a threshold value.

7. The device of claim 1,
wherein the controller is configured to control the heater unit to emulate a characteristic heat emission during a charging or discharging of the battery.

8. The device of claim 1,
wherein the battery simulation unit comprises at least one data interface which is configured to forward data to the DUT.

9. The device of claim 8,
wherein the controller is configured to provide battery identification information and to control the data interface to forward said battery identification information to the DUT.

10. The device of claim 8,
wherein the controller is configured to generate simulated temperature sensor readings and to control the data interface to forward said simulated temperature sensor readings to the DUT.

11. The device of claim 10,
wherein the simulated temperature sensor readings comprise temperature values that deviate from the temperature values measured with the temperature sensor.

12. A test system for a DUT comprising:
a test chamber for inserting the DUT;
the device of claim 1 for simulating a battery of the DUT; and
one or more sensor units for monitoring the DUT.

13. The test system of claim 12,
wherein the one or more sensor units comprise a communication sensor unit which is configured to exchange communication data with the DUT;
wherein the communication sensor unit is configured to monitor a data transmission rate of said communication with the DUT as a function of the heating of the battery simulation unit by the heater unit and/or the temperature measured with the temperature sensor.

14. The test system of claim 12,
wherein the one or more sensor units comprise a DUT temperature sensor;
wherein the DUT temperature sensor is configured to monitor a temperature of the DUT while the battery simulation unit supplies the DUT with electrical power or drains electrical power from the DUT.

15. A method for simulating a battery of a device-under-test (DUT), comprising the steps of:
inserting a battery simulation unit into a battery reception unit of the DUT;
simulating electrical characteristics of a battery with the battery simulation unit;
supplying electrical power to the DUT or draining electrical power from the DUT based on the simulated electrical characteristics;
measuring a temperature at or in the battery simulation unit; and
heating the battery simulation unit.

16. The method of claim 15, further comprising the step of:
measuring a voltage and/or current of the electrical power that is supplied to the DUT or drained from the DUT.

* * * * *